(12) United States Patent
Akimoto

(10) Patent No.: US 7,795,631 B2
(45) Date of Patent: Sep. 14, 2010

(54) LIGHT-EMITTING DEVICE

(75) Inventor: Katsuya Akimoto, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 431 days.

(21) Appl. No.: 11/905,066

(22) Filed: Sep. 27, 2007

(65) Prior Publication Data

US 2008/0277679 A1    Nov. 13, 2008

(30) Foreign Application Priority Data

May 11, 2007 (JP) ............................. 2007-126676

(51) Int. Cl.
*H01L 33/00* (2010.01)
(52) U.S. Cl. .............. 257/94; 257/95; 257/96; 257/E33.032; 438/22; 438/46
(58) Field of Classification Search ............ 257/94–97, 257/E33.032, E33.067; 438/22, 46, 47
See application file for complete search history.

(56) References Cited

U.S. PATENT DOCUMENTS 6,366,598 B1 *  4/2002  Nichols et al. .............. 372/102
2004/0247009 A1  12/2004  Noda et al.

FOREIGN PATENT DOCUMENTS

| JP | 3561244 | 6/2004 |
| JP | 2006-49855 | 2/2006 |

OTHER PUBLICATIONS

Inoue, Kuon, "Control of Optical Field by Using a Photonic Crystal", Chitose Institute of Science and Technology, vol. 22, No. 11, Aug. 3, 2001, pp. 702-709.

* cited by examiner

*Primary Examiner*—Thinh T Nguyen
(74) *Attorney, Agent, or Firm*—McGinn IP Law Group, PLLC

(57) ABSTRACT

A light-emitting device, including a compound semiconductor layer disposed on a substrate, includes a light-emitting layer, and a dielectric constant change structure formed in a part of the compound semiconductor layer including a main surface as a light extraction surface of the compound semiconductor layer. The dielectric constant change structure is devoid of revolution symmetry provided by randomly changing a periodicity of a dielectric constant in a two-dimensional lattice pattern, with respect to a photonic crystal structure in which more than two kinds of materials having different dielectric constants are periodically and alternately disposed on the main surface in the two-dimensional lattice pattern.

7 Claims, 5 Drawing Sheets

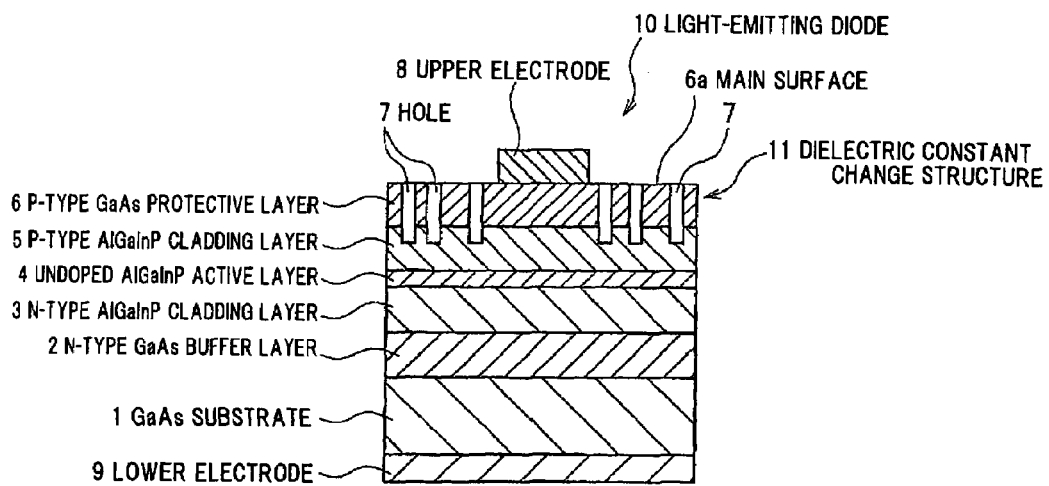
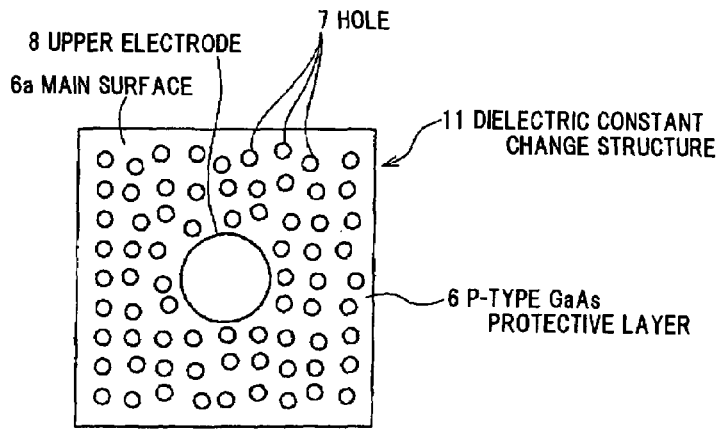

LIGHT-EMITTING DEVICE

The present application is based on Japanese Patent Application No. 2007-126676 filed on May 11, 2007, the entire contents of which are incorporated herein by reference.

BACKGROUND OF THE INVENTION

1. Field of the Invention

This invention relates to a light-emitting device including a light-emitting layer made of a compound semiconductor. More specifically, the light-emitting device is for increasing a light extraction efficiency while a variation of an emission intensity and a wavelength depending on a radiation angle are controlled. The light-emitting device according to the present invention can be used for a device such as a lighting appliance, a backlight for a liquid crystal display (LCD), various types of indicator, a display panel, and the like.

2. Description of the Related Art

In recent years, as applications of a light-emitting diode (LED) increase, a demand for an increased optical output also has increased.

Concerning the demand, a way that a concavity and convexity are formed on a main surface of the light-emitting diode in a two-dimensional periodic structure, and the light extraction efficiency from the concave-convex surface is increased by use of a diffraction effect thereof, is proposed (referring to, for example, Japanese Patent Publication JP-A-2006-49855, (hereinafter, "patent document 1")). In this way, the two-dimensional periodic structure (i.e., a photonic crystal) is formed on the main surface. A transmittance of the photonic crystal greatly depends on an incident wavelength and direction of light, and polarization (referring to, for example, Inoue Kuon, "Control of Optical Field by Using a Photonic Crystal", Surface Science (The Surface Science Society of Japan), 2001, Vol. 22, No. 11 (hereinafter, "nonpatent document 1")).

As an example taking advantage of the above properties of the photonic crystal, a two-dimensional photonic crystal surface emitting laser is known, in which a polarization direction is controlled by making the photonic crystal asymmetric (e.g., referring to JP-B-3561244 (hereinafter, "patent document 2")).

The structure according to patent document 1 is superior in increasing light extraction efficiency. However, when the structure is applied to a light-emitting diode, some problems occur.

Although the photonic crystal is extremely effective for being applied to a laser, there are some circumstances different from the photonic crystal being applied to a light-emitting diode. Firstly, the light-emitting diode has a light-emitting wavelength broader than that of a laser. Secondly, the light-emitting diode has a light radiation angle much wider than that of a laser. Therefore, since a transmittance of the photonic crystal depends on the incident wavelength and a direction of light as mentioned in the nonpatent document, the following problems occur.

Firstly, a light intensity varies depending on a radiation angle of the light-emitting diode. Secondly, a light-emitting spectrum varies depending on a radiation angle of the light-emitting diode. Specifically, a luminance and a color are viewed much differently depending on an angle looking into the light-emitting diode. The phenomenon can cause color or illumination shadings when the light-emitting diode is applied to an illumination or a backlight of an LCD.

SUMMARY OF THE INVENTION

In view of the foregoing and other exemplary problems, drawbacks, and disadvantages of the conventional methods and structures, an exemplary feature of the present invention is to provide a light-emitting device which increases a light extraction efficiency while an emission intensity and a variation of a wavelength depending on a radiation angle are controlled.

According to one exemplary aspect of the invention, a light-emitting device, includes:

a compound semiconductor layer disposed on a substrate, the compound semiconductor layer including a light-emitting layer; and a dielectric constant change structure formed in a part of the compound semiconductor layer including a main surface as a light extraction surface of the compound semiconductor layer, wherein the dielectric constant change structure is devoid of revolution symmetry provided by randomly changing a periodicity of a dielectric constant in a two-dimensional lattice pattern, with respect to a photonic crystal structure in which more than two kinds of materials having different dielectric constants are periodically and alternately disposed on the main surface in the two-dimensional lattice pattern.

In the above exemplary invention, many exemplary modifications and changes can be made.

For example, the dielectric constant change structure includes a concave-convex shape which is formed in a deposition having no revolution symmetry on the main surface.

Further, the light-emitting layer includes a $Al_xGa_yIn_{1-x-y}P$ layer ($0 \leq x \leq 1$, $0 \leq y \leq 1$, $0 \leq x+y \leq 1$).

Additionally, the substrate includes GaAs.

Still further, the dielectric constant change structure includes a hole formed therein.

The hole includes at least one of a cylindrical shape, a conical shape, a prismatic shape, and a pyramidal shape.

Further, the hole may be filled by a resin.

The above exemplary modifications may be made alone or in any combination thereof.

BRIEF DESCRIPTION OF THE DRAWINGS

The foregoing and other exemplary purposes, aspects and advantages will be better understood from the following detailed description of an exemplary embodiment of the invention with reference to the drawings, in which:

FIGS. 1A and 1B show a light-emitting diode 10 in an exemplary embodiment according to the present invention, in which FIG. 1A is a longitudinal sectional view, and FIG. 1B is a top view;

FIGS. 3A and 3B show a light-emitting diode in an example according to the present invention, in which FIG. 3A is a longitudinal sectional view showing the light-emitting diode A mounted on a stem, and FIG. 3B is a top view showing the light-emitting diode A mounted on the stem;

FIGS. 4A and 4B show a light-emitting diode in a comparative example 1, in which FIG. 4A is a longitudinal sectional view showing the light-emitting diode B mounted on a stem, and FIG. 4B is a top view showing the light-emitting diode B mounted on the stem;

FIGS. 5A and 5B show a light-emitting diode in a comparative example 2, in which FIG. 5A is a longitudinal sectional view showing the light-emitting diode C mounted on a stem, and FIG. 5B is a top view showing the light-emitting diode C mounted on the stem;

DETAILED DESCRIPTION OF THE EXEMPLARY EMBODIMENTS

Figure 2:
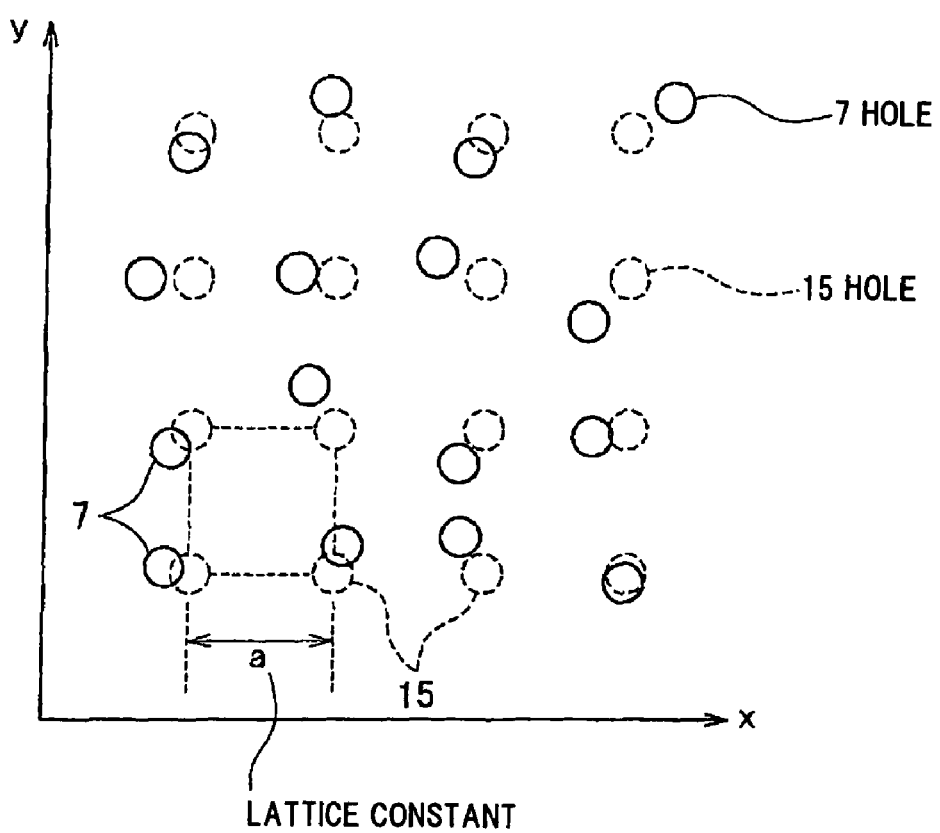
FIG. 2 is a view explaining a disposition of holes shown in FIG. 1.

Referring now to the drawings, and more particularly to FIGS. 1-7C, there are shown exemplary embodiments of the methods and structures according to the present invention.

Exemplary Embodiment 1

Hereinafter, a light-emitting diode in an exemplary embodiment according to the present invention is described with reference to the drawings.

FIGS. 1A and 1B show a light-emitting diode 10 (bare chip) in an exemplary embodiment according to the present invention. FIG. 1A is a longitudinal sectional view, and FIG. 1B is a top view.

For making the light-emitting diode 10, an n-type GaAs buffer layer 2, an n-type AlGaInP cladding layer 3, an undoped AlGaInP active layer 4, a p-type AlGaInP cladding layer 5, and a p-type GaAs protective layer 6 are disposed on an n-type GaAs substrate 1 by metalorganic vapor phase epitaxy (MOVPE) in order, and an epitaxial wafer for the light-emitting diode is made.

Next, the p-type GaAs protective layer 6 of the epitaxial wafer is pierced from a surface of the p-type GaAs protective layer 6 as a light extraction surface by photolithography equipment and reactive ion etching (RIE) equipment, and multiple cylindrical holes 7 which reach to p-type AlGaInP cladding layer 5 through the p-type GaAs protective layer 6, are formed in the p-type GaAs protective layer 6.

With regard to a disposition of each of the holes 7, the holes 7 are formed in a location randomly displaced from where holes 15 periodically formed in a two-dimensional square lattice pattern (distance (lattice constant) a between two closest holes 15) as a photonic crystal shown with dotted lines in FIG. 2, will be located. In this case, the holes 7 are not formed on a part or area of the p-type GaAs protective layer 6 where an upper electrode 8 is formed through a later process.

In main surface 6a of the p-type GaAs protective layer 6 as the light extraction surface, two or more kinds of materials (e.g., GaAs of the p-type GaAs protective layer 6 and air in the holes 7) having different dielectric constants (refractive indexes) provide a dielectric constant change structure 11, which is a dielectric constant distribution having no revolution symmetry (when rotating the p-type GaAs protective layer 6 around a perpendicular line of the main surface 6a, a disposition of the holes 7 does not have a revolution symmetry) provided by randomly changing a periodicity of a dielectric constant in the two-dimensional square lattice pattern, with respect to a photonic crystal structure alternately disposed in the main surface 6a in the two-dimensional square lattice pattern.

For example, where the light-emitting diode 10 (bare chip) shown in FIG. 1 is sealed by a resin and the holes 7 are filled by the resin when packaging the light-emitting diode 10, the dielectric constant change structure 11 including a material such as resin filling the holes 7 (the material includes an air when the holes 7 are not filled by a resin) and the GaAs is formed.

Next, the upper electrode 8 is formed on an area of the p-type GaAs protective layer 6 where the holes 7 are not formed, and a lower electrode 9 is formed on a back surface of the GaAs substrate 1. Then, the wafer is cut (diced) into chips in a predetermined dimension so that the upper electrode 8 will be located at the center thereof, and an AlGaInP light-emitting diode (bare chip) having a double heterostructure shown in FIG. 1 is made.

In comparison with a conventional light-emitting diode in which the holes 7 are not formed on the p-type GaAs protective layer 6 and the main surface thereof is flat, a total reflection can be suppressed, a light from the active layer (light-emitting layer) 4 can be extracted from the LED 10 more effectively, and the light extraction efficiency can increase, by a diffraction effect occurring from the dielectric constant change structure 11 of the main surface 6. Additionally, since the dielectric constant change structure 11 does not have the revolution symmetry, a transmittance does not greatly depend on an incident wavelength and a direction of light like a photonic crystal. That is, the LED 10 can uniformly extract a light in all directions, and a variation of an intensity or wavelength depending on a radiation angle of light radiating from the main surface 6a of the LED 10 hardly occurs.

Although any structures and shapes are suitable for the dielectric constant change structure of the light-emitting device according to the present invention, considering an ease of manufacturing and an effect, it is preferred to form a concave-convex structure and shape on the main surface as in the above exemplary embodiment. With respect to the concave-convex structure and shape, a portion occupying a larger area on the main surface can be either a concave portion or a convex portion.

Further, the light-emitting layer (active layer) of the light-emitting device according to the present invention exemplarily has at least one layer described by $Al_xGa_yIn_{1-x-y}P$ ($0 \leq x \leq 1$, $0 \leq y \leq 1$, $0 \leq x+y \leq 1$), and a substrate holding the light-emitting layer is exemplarily made of GaAs (Gallium Arsenide). This is a structure of an AlGaInP light-emitting diode which is frequently used as a high-intensity red light-emitting diode. Generally, the AlGaInP light-emitting diode is formed on a GaAs substrate in consideration of lattice matching. However, since the GaAs is not transparent with respect to red light, the AlGaInP light-emitting diode cannot use a method such as flip chip mounting which is frequently used for a gallium nitride light-emitting diode mounted on a sapphire substrate. Therefore, for increasing the light extraction efficiency to apply the dielectric constant change structure of the present invention, it is advantageous to provide the AlGaInP light-emitting diode using the GaAs substrate.

Although the above exemplary embodiment is based on a dielectric constant structure of a photonic crystal in which two kinds of materials having different dielectric constants are periodically and alternately disposed in a two-dimensional square lattice pattern along with two directions perpendicular to the main surface, the present invention is not limited thereto.

For example, it can be based on a dielectric constant structure of a photonic crystal in which two kinds of materials having different dielectric constants are periodically disposed in a two-dimensional triangle lattice pattern along with two directions intersecting with the main surface by 60°, and can form the holes 7 in a disposition which are randomly displaced from the disposition of the two-dimensional triangle lattice pattern.

Further, although a period of the disposition of the base photonic crystal (lattice constant a) is generally about a half wavelength of a light-emitting wavelength (a peak wavelength of a light-emitting wavelength band), the period can be in a range from a fraction of several to several times of the light-emitting wavelength.

Further, a degree or rate of random changing of the periodicity in the two-dimensional lattice pattern can be, for example, in a range that adjacent holes do not contact (i.e., displacement d is less than "(a/2)–r"), where a displacement is randomly provided with respect to a disposition of a photonic crystal (lattice constant a) in which a hole (the radius is r) is formed in the two-dimensional lattice pattern. Still further, considering a variation according to a method for forming the holes (e.g., etching), a degree of the displacement is exemplarily less than about a half of the d.

Although in the above exemplary embodiment, the holes 7 are formed at where the displacement is randomly provided with respect to a disposition in the two-dimensional lattice pattern, the hole disposed in the two-dimensional lattice pattern can constitute a dielectric constant change structure which a variation of a periodicity is provided by changing a diameter or shape of the hole located in a randomly selected area.

Although in the above exemplary embodiment, the reactive ion etching (RIE) is used for forming the holes 7, a wet etching using a sulfuric acid, a hydrochloric acid, or a mixed solution thereof also is available for forming the holes 7.

Further, although in the dielectric constant change structure 11 of the above exemplary embodiment the hole 7 are cylindrical, the holes 7 need not necessarily have a cylindrical shape. For example, a conical shape, a prismatic shape, and/or a pyramidal shape are available.

Additionally, although in the above exemplary embodiment, the dielectric constant change structure 11 is provided by forming the concave portion (holes 7) on the main surface, the dielectric constant change structure 11 can be the convex portion having a cylindrical shape, a conical shape, a prismatic shape, and/or a pyramidal shape.

Still further, although in the above exemplary embodiment, the photolithography is used for forming the dielectric constant change structure 11 not having a revolution symmetry, it is not necessary to use the photolithography. For example, it is possible to apply the wet etching without forming a pattern on a wafer. Additionally, it is also possible to use a self-assembled mask pattern.

Yet additionally, although in the above exemplary embodiment, the red light-emitting device using AlGaInP in the light-emitting layer is described, AlGaAs or GaP can be used. Additionally, the present invention can be applied to an infrared light-emitting device using InGaAs or InGaAsP, and to a blue or ultraviolet light-emitting device using InGaN or AlGaN.

Furthermore, the light-emitting device according to the present invention can be applied to not only a light-emitting device using a GaAs substrate as a supporting substrate, but also, for example, to a light-emitting device in which an efficiency thereof is increased by replacing a substrate supporting a light-emitting layer with a transparent material with respect to a light-emitting wavelength (e.g., F. A. Kish, et al., "Very high efficiency semiconductor wafer-bonded transparent substrate light emitting diodes", Appl. Phys. Lett., Vol. 64, No. 21, pp. 2839-2841, May 1994), or a high-efficiency light-emitting device having a reflective submount (e.g., Japanese Patent Publication JP-A-2005-513787).

Example 1

Next, a light-emitting diode of an example of the present invention is described.

Figure 3A:
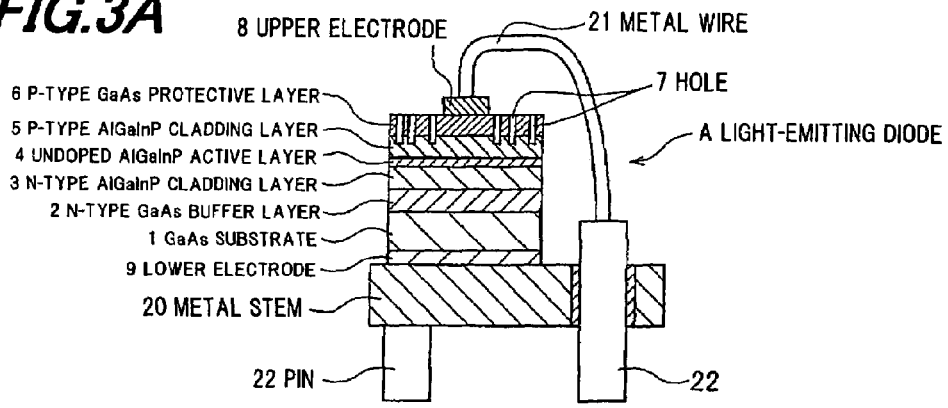
Figure 3B:
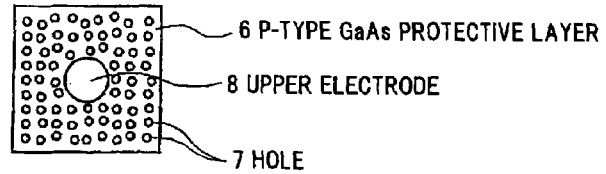

The light-emitting diode in the example according to the present invention is shown in FIGS. 3A and 3B. FIG. 3A is a longitudinal sectional view showing the light-emitting diode mounted on a stem, and FIG. 3B is a top view showing the light-emitting diode (bare chip) mounted on the stem.

Firstly, an epitaxial wafer for the light-emitting diode is made just like the above exemplary embodiment. An Si-doped n-type GaAs substrate (circular wafer) 1, a thickness of which may be 300 μm, is mounted on a metalorganic vapor phase epitaxy equipment, and heated up. A group III metalorganic material gas, a group V material gas, and a necessary dopant material gas with a hydrogen carrier gas are supplied to the n-type GaAs substrate 1. An Se-doped n-type GaAs buffer layer 2, a Se-doped n-type $(Al_{0.7}Ga_{0.3})_{0.5}In_{0.5}P$ cladding layer 3, an undoped $(Al_{0.15}Ga_{0.85})_{0.5}In_{0.5}P$ active layer 4, a Zn-doped p-type $(Al_{0.7}Ga_{0.3})_{0.5}In_{0.5}P$ cladding layer 5, and a Zn-doped p-type GaAs protective layer 6 are disposed on an n-type GaAs substrate 1 by the MOVPE in order, and an epitaxial wafer for the light-emitting diode which has an exemplary light-emitting wavelength of 630 nm is made.

The circular epitaxial wafer is divided into four quarter circles, three of them are set as an epitaxial wafer A, an epitaxial wafer B, an epitaxial wafer C, respectively. The rest of the epitaxial wafer is made due to dividing the wafer into four quarter circles, and is not used in this example.

In the epitaxial wafer A, multiple cylindrical holes 7 are formed by use of the photolithography equipment and the reactive ion etching equipment, which reach to the p-type $(Al_{0.7}Ga_{0.3})_{0.5}In_{0.5}P$ cladding layer 5 through the p-type GaAs protective layer 6 and have an exemplary diameter of 20 nm and an exemplary depth of 100 nm (referring to FIGS. 3A and 3B).

Regarding a deposition of the holes 7, based on a dielectric constant structure of a two-dimensional photonic crystal in a two-dimensional square lattice pattern (a distance between the closest holes, that is, a lattice constant is exemplarily 220 nm), the holes 7 are formed in a location randomly displaced from a deposition of the two-dimensional square lattice pattern, similarly to FIG. 2. In this case, the holes 7 are not formed on an area of the p-type GaAs protective layer 6 where an upper electrode 8 is formed.

Next, the upper electrode 8 is formed on an area of the p-type GaAs protective layer 6 where the holes 7 are not formed, and a lower electrode 9 is formed on an entire back surface of the GaAs substrate 1. The upper electrode 8 is exemplarily a circular shape having an exemplary diameter of 100 μm.

Then, the epitaxial wafer A is cut into chips of exemplarily 300 μm on a side so that the upper electrode 8 will locate at the center thereof. Subsequently, the lower electrode 9 of the chip is mounted on a metal stem 20, and the upper electrode 8 and a pin 22 which is formed in the metal stem 20 with insulation, are wire-bonded by a metal wire 21 (FIG. 3A). Through the above steps, an AlGaInP light-emitting diode having a double heterostructure is made. The light-emitting diode made thereby is defined as "a light-emitting diode A".

The deposition of the holes 7 in the epitaxial wafer A mentioned above is decided by following steps.

In this example, based on the exemplary two-dimensional square lattice pattern of 220 μm pitch, the deposition of the holes 7 is displaced by a random number. This is for ease of calculation. The deposition of the holes 7 can be made by a different algorithm.

The main surface of the light-emitting diode A is rendered by two-dimensional Cartesian coordinates (x, y) in which an edge of the chip is defined as an origin (0, 0). A unit of the x and y is nm. Since the chip is exemplarily 300 μm on a side, a value of the x and y is exemplarily not less than 0 and not more than 300,000.

The point ($X_{00}=220$, $y_{00}=220$) is defined as a location of the first hole 7, and then locations of the holes 7 ($x_{01}$, $y_{01}$), ($x_{02}$, $y_{02}$), ($x_{03}$, $y_{03}$), . . . , which are displaced from lattice points (440, 220), (660, 220), (880, 220), . . . of a square lattice pattern located on y=220, are decided. When deciding the location, a two-digit pseudo-random number $\alpha_{mn}$ is generated by a mixed congruential method.

In this example, the deposition of the holes 7 having no revolution symmetry is decided by using the pseudo-random number provided by the mixed congruential method. Although there are other methods (e.g., algorithms) for generating the pseudo-random number such as a Mersenne twister, etc., since a nature of the present invention is not of a quality of the pseudo-random number, the mixed congruential method which is more easy-to-use is employed hereinbelow.

The mixed congruential method used in the example is explained.

$\alpha'_{mn}$ is obtained from $\alpha_{mn}$ according to the following equation.

$$\alpha'_{mn} = \alpha_{mn} * p + q$$

The last two digits of the obtained $a'_{mn}$ become a pseudo-random number $\alpha_{mn+1}$. Similarly, $a'_{mn+1}$ is obtained from $\alpha_{mn+1}$, and the last two digits of the obtained $\alpha_{mn-1}$ become $\alpha_{mn+2}$.

In this example, the following values are used as initial values.

$\alpha_{00}=5963$, $p=765$, $q=573$

An example of the pseudo-random number obtained in this case is presented below.

$\alpha_{01}=68$, $\alpha_{02}=93$, $\alpha_{03}=18$, . . . .

Using the pseudo-random number $\alpha_{01}$ obtained by the above method, the location of the second hole 7 ($x_{01}$, $y_{01}$) is decided as follows.

$$x_{01}=x_{00}+\alpha_{01}+170$$

$$y_{01}=y_{00}+\alpha_{01}-50$$

Next, the pseudo-random number $\alpha_{02}$ is generated from $\alpha_{01}$, and then the location of the third hole 7 ($x_{02}$, $y_{02}$) is decided as follows.

$$x_{02}=x_{01}+\alpha_{02}+170$$

$$y_{02}=y_{01}+\alpha_{02}-50$$

The locations of the holes 7 are sequentially decided by repeating the above process. The equation can be written collectively as follows.

$$x_{0n}=x_{0n-1}+\alpha_{0n}+170$$

$$y_{0n}=y_{0n-1}+\alpha_{0n}-50$$

n=1, 2, 3, . . . .

Since the location is out of the chip when the $\alpha_{0n}$ is more than 300,000, the process terminates at an appropriate n. The n of this time (e.g., termination) is defined as $n_{0max}$.

The point ($x_{10}=220$, $y_{10}=440$) is defined as a location of the next hole 7, and then locations of the holes 7 ($x_{11}$, $y_{11}$), ($x_{12}$, $y_{12}$), ($x_{13}$, $y_{13}$), . . . , which are displaced from lattice points (440, 440), (660, 440), (880, 440), . . . of a square lattice pattern located on y=440, are decided. In this case, the first pseudo-random number $\alpha_{11}$ is decided by using a pseudo-random number as of the $n_{0max}$ just before. The equation can be written collectively as follows.

$$x_{mn}=x_{mn-1}+\alpha_{mn}+170, x_{m0}=220$$

$$y_{mn}=y_{mn-1}+\alpha_{mn}-50, y_{m0}=220*(m+1)$$

n=1, 2, 3, . . . .
m=0, 1, 2, 3, . . . .

The $\alpha_{mn}$ is decided by use of the $\alpha_{mn-1}$ by the mixed congruential method (the $\alpha_{m1}$ is decided by use of the last pseudo-random number). In this case, a hole located at an area where the electrode 8 is formed, is precluded. By the above processes, a set of the holes not having a strict periodicity is formed on the surface of the LED chip. Clearly, the set of the holes does not have the revolution symmetry with respect to the straight line perpendicularly crossing the central axis of the main surface.

Comparative Example 1

Figure 4A:
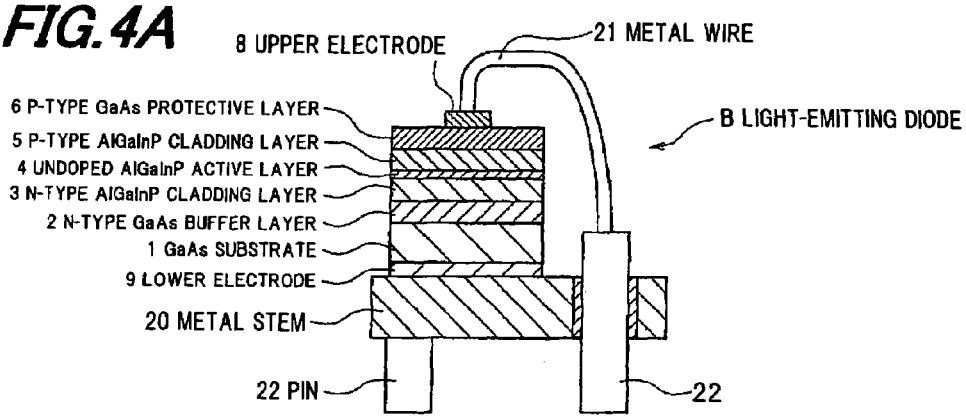
Figure 4B:
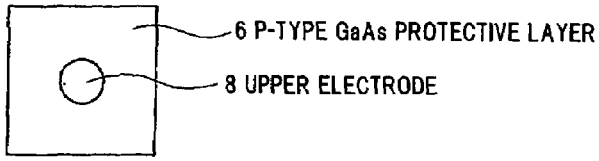

As a comparative example to the above example, in the epitaxial wafer B which is one of the quarter circles, the upper electrode 8 having a diameter of 80 μm is formed on the p-type GaAs protective layer 6 without holes, and the lower electrode 9 is formed on the back surface of the GaAs substrate 1, as shown in FIGS. 4A and 4B. Similarly to the epitaxial wafer A, the epitaxial wafer B is cut into chips of 300 μm on a side, the chips are mounted on the metal stem 20, and the metal wire 21 is bonded to the upper electrode 8 (FIG. 4A). Through these steps, an AlGaInP light-emitting diode having a double heterostructure is made. This is a conventional light-emitting diode, and this is defined as "a light-emitting diode B".

Comparative Example 2

Figure 5A:
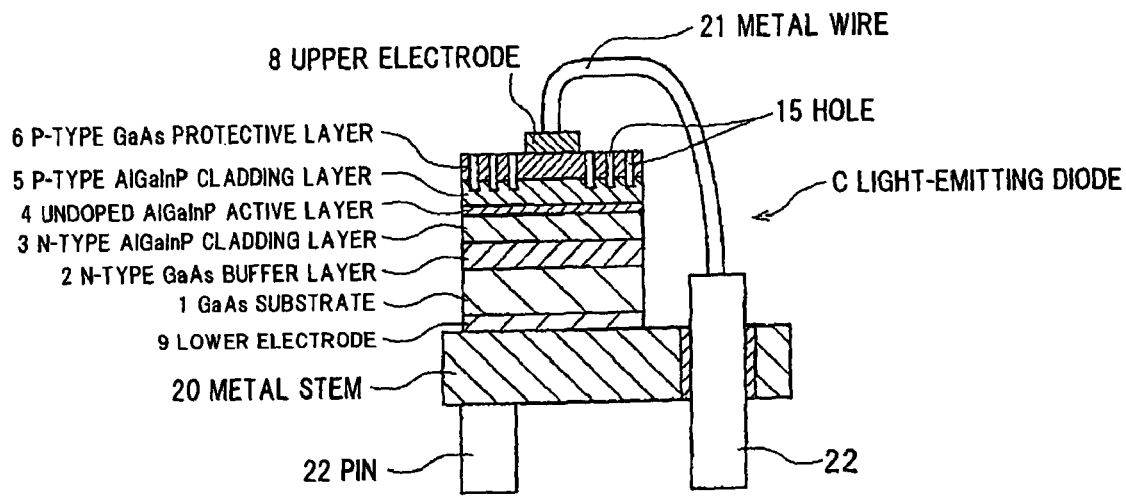
Figure 5B:
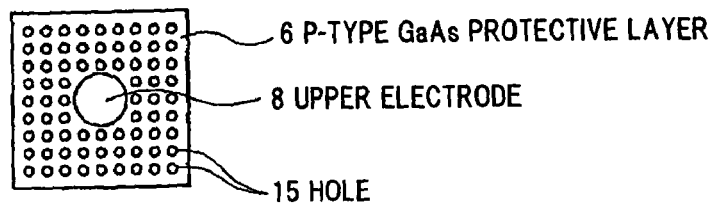

Further, as another comparative example to the above example, in the epitaxial wafer C which is one of the quarter circles, multiple cylindrical holes 15 are formed in a two-dimensional square lattice pattern, which reach to the p-type $(Al_{0.7}Ga_{0.3})_{0.5}In_{0.5}P$ cladding layer 5 through the p-type GaAs protective layer 6 and have a diameter of 20 nm and a depth of 100 nm, as shown in FIGS. 5A and 5B. A distance between the closest holes 15 (lattice constant) is set to 220 nm. Similarly to the epitaxial wafer A, the epitaxial wafer C is also cut into chips of 300 μm on a side, mounted on the metal stem 20, and the metal wire 21 is bonded, after the upper electrode 8 and lower electrode 9 are formed (FIG. 5A). The holes 15 disposed in the two-dimensional square lattice pattern are a two-dimensional photonic crystal, and the light-emitting diode is defined as "a light-emitting diode C".

As a result of conducting a current of 20 mA to each of the light-emitting diodes A, B, and C and measuring an emission output, the emission output of the light-emitting diodes A is 2.5 mW, the emission output of the light-emitting diodes B is 1.2 mW, and the emission output of the light-emitting diodes C is 2.7 mW. The fact that the emission intensities of the light-emitting diodes A and C are greater than that of the light-emitting diodes B indicates an improvement of the light extraction efficiency by the dielectric constant dispersion structure where the multiple holes 7 or holes 15 are formed.

Figure 6:
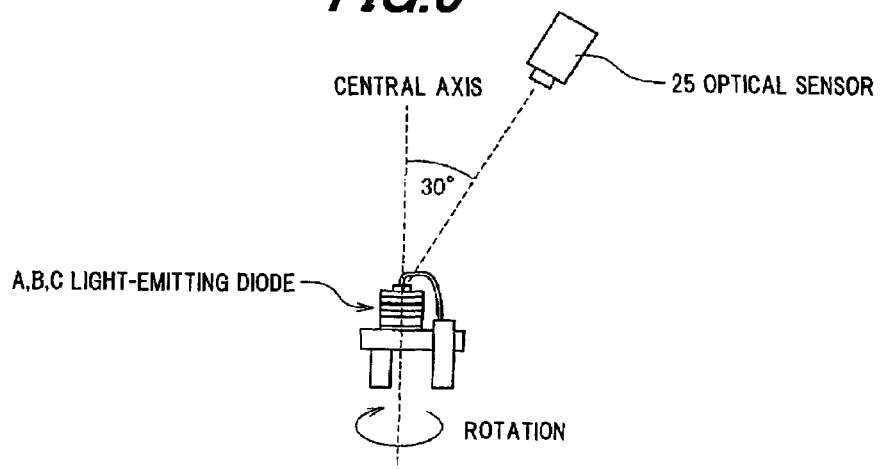
FIG. 6 is a view showing a measuring method of a light distribution characteristic of the light-emitting diodes according to the example 1 and comparative examples 1 and 2.

Next, a light distribution characteristic is measured with respect to the light-emitting diodes A, B, and C. As shown in FIG. 6, an optical sensor 25 is mounted on a location which inclines 30° from a line (central axis) perpendicularly crossing the main surface on the central of the main surface of the light-emitting diodes A, B, and C. A light intensity is measured by rotating the light-emitting diodes A, B, and C around the central axis, and the light distribution is obtained. In this case, a direction parallel with an arbitrary side on the main surface is defined as 0°, and the light intensity is measured in some angles while rotating the light-emitting diodes A, B, and C in a right-hand (clockwise) direction as viewed from a side where the upper electrode 8 is formed.

Figure 7A:
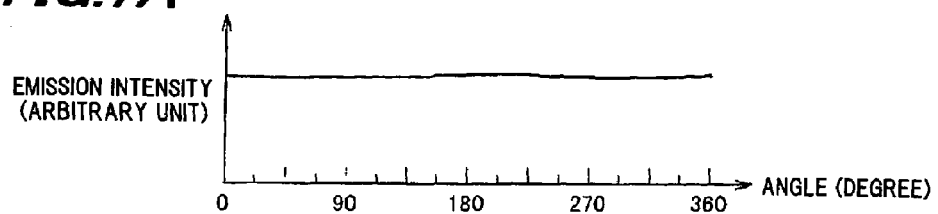
FIGS. 7A to 7C are views showing light distribution characteristics of the light-emitting diodes according to the example 1 and comparative examples 1 and 2.
Figure 7B:
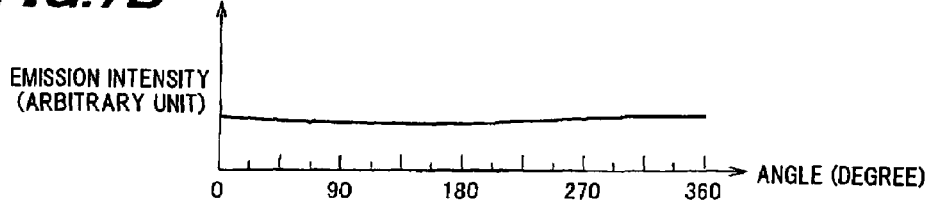
Figure 7C:
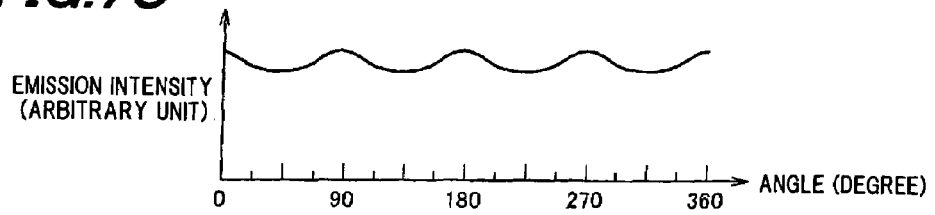

Results measured are shown in FIGS. 7A to 7C. FIG. 7A shows the light distribution characteristic of the light-emitting diode A of the example 1, FIG. 7B shows the light distribution characteristic of the light-emitting diode B of the comparative example 1 (flat main surface), and FIG. 7C shows the light distribution characteristic of the light-emitting diode C of the comparative example 2 (two-dimensional photonic crystal structure).

As shown in FIGS. 7A to 7C, the light-emitting diodes A and B can obtain substantially equal light distribution characteristics in all directions. On the other hand, the light-emitting diode C shows a tendency as the light intensity is specifically strong in directions of 0°, 90°, 180°, and 360°. This is caused by a strong effect of a four-fold symmetry which the two-dimensional square lattice pattern formed on the surface of the light-emitting diode C has.

By the above results, it can be proved that the light-emitting diode A of the example 1 can improve the light extraction efficiency while the variation of the light intensity depending on a radiation angle can be suppressed.

Other Exemplary Embodiments

Although the invention has been described with respect to specific exemplary embodiments for complete and clear disclosure, the appended claims are not to be thus limited but are to be construed as embodying all modifications and alternative constructions that may occur to one skilled in the art which fairly fall within the basic teaching herein set forth.

Further, it is noted that Applicant's intent is to encompass equivalents of all claim elements, even if amended later during prosecution.

What is claimed is:

1. A light-emitting device, comprising:
   a compound semiconductor layer disposed on a substrate, said compound semiconductor layer comprising a light-emitting layer; and
   a dielectric constant change structure formed in a part of said compound semiconductor layer including a main surface as a light extraction surface of said compound semiconductor layer,
   wherein said dielectric constant change structure is devoid of revolution symmetry provided by randomly changing a periodicity of a dielectric constant in a two-dimensional lattice pattern, with respect to a photonic crystal structure in which more than two kinds of materials having different dielectric constants are periodically and alternately disposed on the main surface in the two-dimensional lattice pattern.

2. The light-emitting device according to claim 1, wherein: said dielectric constant change structure comprises a concave-convex shape which is formed in a deposition having no revolution symmetry on the main surface.

3. The light-emitting device according to claim 1, wherein: said light-emitting layer comprises a $Al_xGa_yIn_{1-x-y}P$ layer ($0 \leq x \leq 1$, $0 \leq y \leq 1$, $0 \leq x+y \leq 1$).

4. The light-emitting device according to claim 1, wherein: said substrate comprises GaAs.

5. The light-emitting device according to claim 1, wherein: said dielectric constant change structure includes a hole formed in said main surface.

6. The light-emitting device according to claim 5, wherein: the hole includes at least one of a cylindrical shape, a conical shape, a prismatic shape, and a pyramidal shape.

7. The light-emitting device according to claim 5, wherein: the hole is filled by a resin.

* * * * *